US010128748B2

United States Patent
Uno et al.

(10) Patent No.: US 10,128,748 B2
(45) Date of Patent: Nov. 13, 2018

(54) SWITCHING POWER-SUPPLY APPARATUS AND DROOP CHARACTERISTIC CORRECTION METHOD

(71) Applicant: Murata Manufacturing Co., Ltd., Nagaokakyo-shi, Kyoto-fu (JP)

(72) Inventors: Yoshiyuki Uno, Nagaokakyo (JP); Hajime Shiji, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/964,105

(22) Filed: Apr. 27, 2018

(65) Prior Publication Data

US 2018/0248478 A1 Aug. 30, 2018

Related U.S. Application Data

(63) Continuation of application No. PCT/JP2016/081664, filed on Oct. 26, 2016.

(30) Foreign Application Priority Data

Nov. 30, 2015 (JP) .................................. 2015-233106

(51) Int. Cl.
*H02M 3/158* (2006.01)
*H02M 3/155* (2006.01)
(Continued)

(52) U.S. Cl.
CPC ............. *H02M 3/155* (2013.01); *H02M 3/07* (2013.01); *H03K 3/57* (2013.01); *H03K 17/145* (2013.01); *H02M 3/158* (2013.01)

(58) Field of Classification Search
CPC ........ H02M 3/07; H02M 3/155; H02M 3/156; H02M 3/158; H02M 2003/155;
(Continued)

(56) References Cited

U.S. PATENT DOCUMENTS 7,304,462 B2 * 12/2007 Shvarts ..................... H02J 1/10
323/272
2013/0073109 A1 * 3/2013 Cheng ....................... H02J 3/40
700/298

(Continued)

FOREIGN PATENT DOCUMENTS

JP 08-289468 A 11/1996
JP 2009-261079 A 11/2009
(Continued)

OTHER PUBLICATIONS

Official Communication issued in International Patent Application No. PCT/JP2016/081664, dated Jan. 10, 2017.

*Primary Examiner* — Matthew Nguyen
(74) *Attorney, Agent, or Firm* — Keating & Bennett, LLP

(57) ABSTRACT

In a switching power-supply apparatus that controls magnitudes of output voltages of respective converters connected in parallel to be equal to a target voltage value, only a selected one of the converters is made to operate. In this state, correction values generated by the respective converters are received and stored in memory. Droop characteristics generated for the respective converters are corrected using the correction values. Accordingly, a switching power-supply apparatus and a droop characteristic correction method capable of correcting variations in droop characteristics generated for respective power converters are provided.

15 Claims, 4 Drawing Sheets

(51) Int. Cl.
*H02M 3/07* (2006.01)
*H03K 3/57* (2006.01)
*H03K 17/14* (2006.01)

(58) Field of Classification Search
CPC ...... H02M 2003/156; H02M 2003/158; H03K 3/57; H03K 17/145
See application file for complete search history.

(56) References Cited

U.S. PATENT DOCUMENTS

2015/0023068 A1    1/2015  Uno
2016/0336867 A1*  11/2016  Nystrom ........... H02M 3/33592

FOREIGN PATENT DOCUMENTS

JP        2015-023686 A    2/2015
WO      2015/159785 A1  10/2015

* cited by examiner

SWITCHING POWER-SUPPLY APPARATUS AND DROOP CHARACTERISTIC CORRECTION METHOD

CROSS REFERENCE TO RELATED APPLICATIONS

This application claims the benefit of priority to Japanese Patent Application No. 2015-233106 filed on Nov. 30, 2015 and is a Continuation Application of PCT Application No. PCT/JP2016/081664 filed on Oct. 26, 2016. The entire contents of each application are hereby incorporated herein by reference.

BACKGROUND OF THE INVENTION

1. Field of the Invention

The present invention relates to a switching power-supply apparatus including power converters connected in parallel, and a droop characteristic correction method performed by the switching power-supply apparatus.

2. Description of the Related Art

Japanese Unexamined Patent Application Publication No. 8-289468 discloses a DC power-supply apparatus to perform parallel operation of a plurality of DC power supplies connected in parallel. The DC power-supply apparatus described in Japanese Unexamined Patent Application Publication No. 8-289468 performs droop control in which, as a detected output current of a DC power supply increases, an output voltage is reduced. At this time, when droop characteristics of the respective DC power supplies vary, there is a risk that currents concentrate on one DC power supply, an overcurrent state occurs, and more heat is generated. In addition, there is a risk that a maximum output power of the entire apparatus falls below an expected value. Accordingly, it is important to control load factors of the respective DC power supplies to be even.

As described above, when each of the plurality of DC power supplies performs the droop control, the droop characteristics may vary due to variations in characteristics of individual components. Thus, it may be considered, for example, before factory shipment, to calculate a correction value from a detection result of an output voltage with respect to an output current, store the correction value in a memory, and correct a droop characteristic using the stored correction value when actually used. However, in Japanese Unexamined Patent Application Publication No. 8-289468, only a total output current of the plurality of DC power supplies connected in parallel is detectable. Accordingly, the same correction value is to be used for droop characteristics set for each of the plurality of DC power supplies. As a result, it is difficult to correct variations in detection results of output currents of the respective DC power supplies separately and precisely.

SUMMARY OF THE INVENTION

Preferred embodiments of the present invention provide switching power-supply apparatuses and droop characteristic correction methods capable of correcting variations in droop characteristics generated for respective power converters.

A switching power-supply apparatus according to a preferred embodiment of the present invention includes a first power converter and a second power converter connected in parallel, a first output voltage detector that detects a magnitude of an output voltage of the first power converter, a first controller that performs PWM control on the first power converter so as to equalize a magnitude of an output voltage detected by the first output voltage detector and a target voltage value, a second output voltage detector that detects a magnitude of an output voltage of the second power converter, a second controller that performs PWM control on the second power converter so as to equalize a magnitude of an output voltage detected by the second output voltage detector and the target voltage value, a first droop characteristic generator that generates a droop characteristic that reduces an output voltage of the first power converter as an output current of the first power converter increases, a second droop characteristic generator that generates a droop characteristic that reduces an output voltage of the second power converter as an output current of the second power converter increases, an operation selector that makes only a selected one of the first power converter and the second power converter operate, a first receiver that receives from an external device a first correction value to correct a droop characteristic generated by the first droop characteristic generator, a second receiver that receives from the external device a second correction value to correct a droop characteristic generated by the second droop characteristic generator, a storage that stores a first correction value received by the first receiver and a second correction value received by the second receiver, a first corrector that corrects a droop characteristic generated by the first droop characteristic generator with the first correction value, and a second corrector that corrects a droop characteristic generated by the second droop characteristic generator with the second correction value.

With this configuration, it is possible to make only one of the first power converter and the second power converter operate. Thus, the detected output current and output voltage of the switching power-supply apparatus correspond to an output current and an output voltage, respectively, of one of the first power converter and the second power converter made to operate. A droop characteristic of each of the first power converter and the second power converter may be obtained from this detection result. As a result, a correction value of the droop characteristic may be obtained for each of the first power converter and the second power converter. Thus, variations in the droop characteristics may be eliminated by correcting the droop characteristics of the first power converter and the second power converter separately. Accordingly, variations in output currents of the first power converter and the second power converter may be prevented, thus making it unnecessary to design a switching power-supply apparatus in consideration of the variations, and also enabling the size of a switching power-supply apparatus to be reduced.

In a switching power-supply apparatus according to a preferred embodiment of the present invention, the first receiver receives a first voltage offset value adapted to the first power converter, the second receiver receives a second voltage offset value adapted to the second power converter, the first corrector corrects a magnitude of an output voltage detected by the first output voltage detector with the first voltage offset value, and the second corrector corrects a magnitude of an output voltage detected by the second output voltage detector with the second voltage offset value.

With this configuration, variations in droop characteristics may be further reduced, thus making it unnecessary to design a switching power-supply apparatus in consideration of the variation, and also enabling the size of a switching power-supply apparatus to be reduced.

A switching power-supply apparatus according to a preferred embodiment may include a circuit that prohibits modification of a first correction value and a second correction value stored in the storage.

With this configuration, it is possible to prevent a possibility that droop characteristics undesirably vary due to modification of a first correction value and a second correction value.

A droop characteristic correction method according to a preferred embodiment of the present invention is performed by a switching power-supply apparatus that performs PWM control separately on a first power converter and a second power converter connected in parallel, and makes a magnitude of an output voltage of the first power converter and a magnitude of an output voltage of the second power converter be equal or substantially equal to a target voltage value. The method includes a first generation step of generating a droop characteristic that reduces an output voltage of the first power converter as an output current of the first power converter increases; a second generation step of generating a droop characteristic that reduces an output voltage of the second power converter as an output current of the second power converter increases; an action selection step of making only a selected one of the first power converter and the second power converter operate; a first receiving step of receiving from an external device a first correction value that corrects a droop characteristic generated in the first generating step; a second receiving step of receiving from the external device a second correction value that corrects a droop characteristic generated in the second generating step; a storage step of storing a first correction value received in the first receiving step and a second correction value received in the second receiving step; a first correction step of correcting a droop characteristic generated in the first generation step with the first correction value; and a second correction step of correcting a droop characteristic generated in the second generation step with the second correction value.

With this method, it is possible to make only one of the first power converter and the second power converter operate. Thus, the detected output current and output voltage of the switching power-supply apparatus correspond to an output current and an output voltage, respectively, of one of the first power converter and the second power converter made to operate. A droop characteristic of each of the first power converter and the second power converter may be obtained from this detection result. As a result, a correction value to correct the droop characteristic may be obtained for each of the first power converter and the second power converter. Thus, variations in droop characteristics are eliminated by correcting the droop characteristic of the first power converter and the droop characteristic of the second power converter separately, thus making it unnecessary to design a switching power-supply apparatus in consideration of the variations, and also enabling the size of a switching power-supply apparatus to be reduced.

According to preferred embodiments of the present invention, variations in droop characteristics may be eliminated, thus making it unnecessary to design a switching power-supply apparatus in consideration of the variations, and also enabling the size of a switching power-supply apparatus to be reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred Embodiment 1

Figure 1:
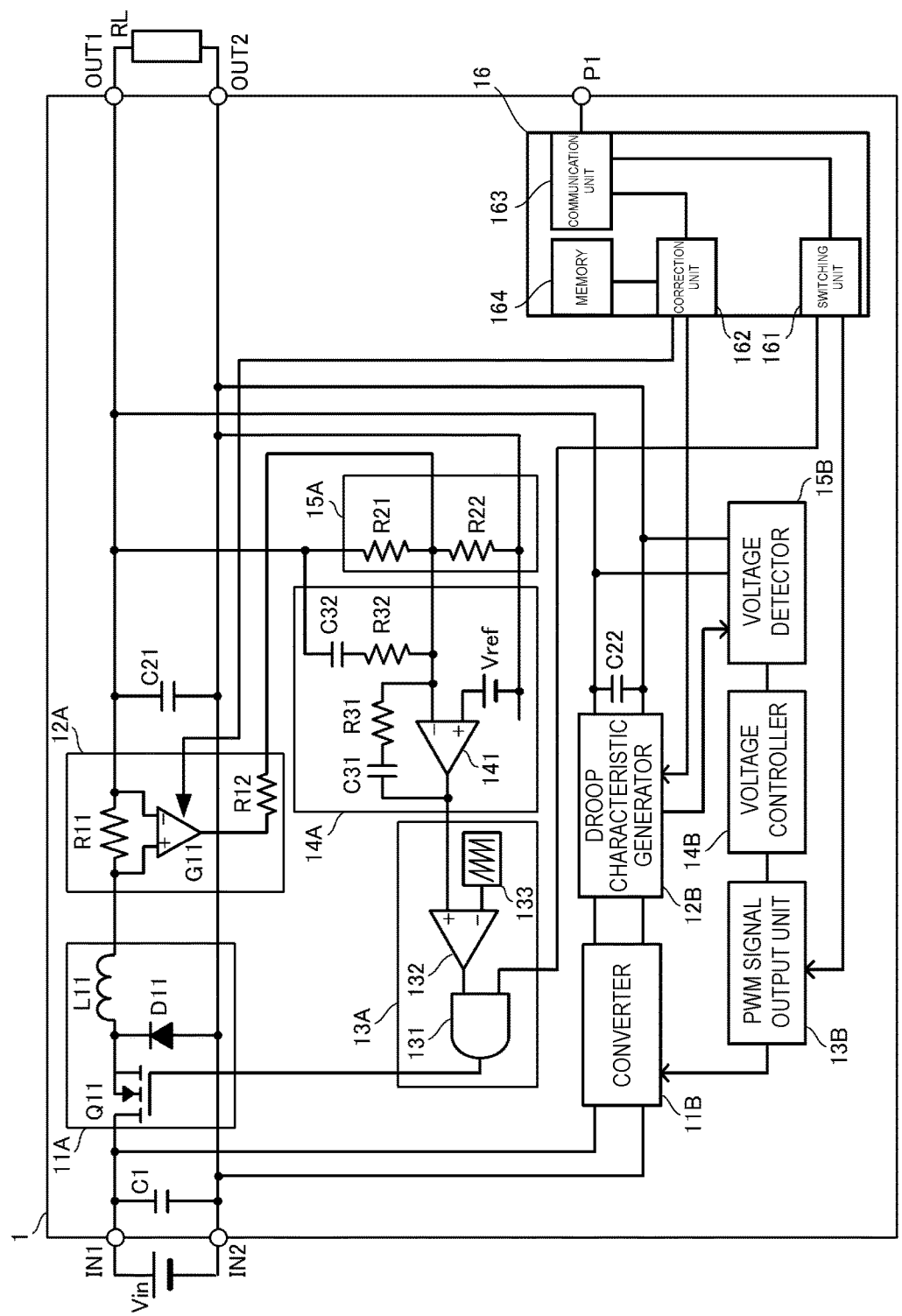
FIG. 1 is a circuit diagram of a switching power-supply apparatus according to Preferred Embodiment 1 of the present invention.

FIG. 1 is a circuit diagram of a switching power-supply apparatus 1 according to Preferred Embodiment 1 of the present invention.

The switching power-supply apparatus 1 is a multiphase DC-DC converter that performs multiphase control on a plurality of step-down converter circuits connected in parallel, steps down a voltage input from an input unit IN1 and outputs the voltage from an output unit OUT1, and steps down a voltage input from an input unit IN2 and outputs the voltage from an output unit OUT2. A DC power supply Vin is connected to the input units IN1 and IN2. A load RL is connected to the output units OUT1 and OUT2.

An input capacitor C1, a converter 11A, a droop characteristic generator 12A, and a smoothing capacitor C21 are connected in this order between the input units IN1 and IN2 and the output units OUT1 and OUT2. A circuit including a converter 11B, a droop characteristic generator 12B, and a smoothing capacitor C22 is connected in parallel with a circuit including the converter 11A, the droop characteristic generator 12A, and the smoothing capacitor C21.

The converter 11A corresponds to a "first power converter", and the converter 11B corresponds to a "second power converter". In addition, the droop characteristic generator 12A corresponds to a "first droop characteristic generator", and the droop characteristic generator 12B corresponds to a "second droop characteristic generator".

The switching power-supply apparatus 1 includes PWM signal output units 13A and 13B, voltage controllers 14A and 14B, and voltage detectors 15A and 15B as circuits that perform constant voltage control on the converters 11A and 11B. Note that, since the converter 11B, the droop characteristic generator 12B, the PWM signal output unit 13B, the voltage controller 14B, and the voltage detector 15B have the same or substantially the same configurations as the converter 11A, the droop characteristic generator 12A, the PWM signal output unit 13A, the voltage controller 14A, and the voltage detector 15A, respectively, each of these elements is illustrated as a block in the drawings.

Each of the converters 11A and 11B is a step-down converter circuit including an n-type MOS-FET switch Q11, a diode D11, and an inductor L11. A gate of the switch Q11 of the converter 11A is connected to the PWM signal output unit 13A, and a gate of the switch Q11 of the converter 11B is connected to the PWM signal output unit 13B, and gate signals are input from the PWM signal output units 13A and 13B, respectively.

Each of the droop characteristic generators 12A and 12B generates a drooping correction value to obtain current-voltage characteristics, namely droop characteristics, that reduce an output voltage of the converter 11A as an output current of the converter 11A increases, and reduce an output voltage of the converter 11B as an output current of the converter 11B increases, respectively. Specifically, the droop characteristic generators 12A and 12B each include resistors R11 and R12, and a variable gain amplifier G11. A voltage across the resistor R11 is input into the variable gain amplifier G11, and the variable gain amplifier G11 amplifies the voltage with a gain set by a microcomputer 16 described later. The droop characteristic generator 12A outputs a signal in accordance with a magnitude of an output current of the converter 11A, and the droop characteristic generator 12B outputs a signal in accordance with a magnitude of an output current of the converter 11B. These signals, as the drooping correction values, are input into the voltage detectors 15A and 15B, respectively.

The drooping correction value increases as the output current increases. These drooping correction values are input into the voltage detectors 15A and 15B, respectively. Thus, apparent magnitudes of output voltages detected by the respective voltage detectors 15A and 15B increase. As the output voltage increases, the PWM signal output unit 13A described later controls the converter 11A and the PWM signal output unit 13B described later controls the converter 11B so as to decrease the output voltage. As a result, the converters 11A and 11B have such characteristics that output voltages thereof reduce as output currents increase, respectively.

The voltage detectors 15A and 15B each include voltage-dividing resistors R21 and R22, and detect the output voltages of the converters 11A and 11B (specifically, divided voltages thereof), respectively. A node between the voltage-dividing resistors R21 and R22 in the voltage detector 15A is connected to the voltage controller 14A, and a node between the voltage-dividing resistors R21 and R22 in the voltage detector 15B is connected to the voltage controller 14B. The voltage detector 15A corresponds to a "first output voltage detector". The voltage detector 15B corresponds to a "second output voltage detector".

The voltage controllers 14A and 14B each include an error amplifier 141 and a phase compensation circuit including capacitors C31 and C32 and resistors R31 and R32. A reference voltage Vref is input into a non-inverted input terminal (+) of each of the error amplifiers 141. The output voltages (specifically, divided voltages thereof) detected by the voltage detectors 15A and 15B are input into inverted input terminals (−), respectively. The reference voltage Vref corresponds to a target voltage value output by each of the converters 11A and 11B. The error amplifier 141 in the voltage controller 14A amplifies an error between the output voltage of the converter 11A and the reference voltage Vref and outputs the resultant signal, and the error amplifier 141 in the voltage controller 14B amplifies an error between the output voltage of the converter 11B and the reference voltage Vref and outputs the resultant signal. An output signal from the error amplifiers 141 in the voltage controller 14A is input into the PWM signal output unit 13A, and an output signal from the error amplifier 141 in the voltage controller 14B is input into the PWM signal output unit 13B.

The PWM signal output units 13A and 13B each include an AND gate 131, a comparator 132, and a clock generator 133. An output of the AND gates 131 in the PWM signal output unit 13A is connected to a gate of the switch Q11 of the converter 11A and an output of the AND gate 131 in the PWM signal output unit 13B is connected to a gate of the switch Q11 of the converter 11B. An output of the compara- tor 132 and a switching circuit 161 of the microcomputer 16 are connected to an input of the AND gate 131.

The PWM signal output unit 13A and the voltage controller 14A correspond to a "first controller". Further, the PWM signal output unit 13B and the voltage controller 14B correspond to a "second controller".

When an L-level signal is input from the switching circuit 161 of the microcomputer 16 to the AND gate 131, the AND gate 131 outputs the L-level signal. This turns the switch Q11 off. When an H-level signal is input from the switching circuit 161 of the microcomputer 16 to the AND gate 131, the AND gate 131 outputs an H-level signal or an L-level signal output from the comparator 132 as is. This turns the switch Q11 on/off.

The clock generator 133 outputs a clock signal to the AND gate 131. Note that, the clock generator 133 of the voltage controller 14A and the clock generator 133 of the voltage controller 14B generate clock signals having different phases from each other.

An output signal from the voltage controller 14A and a clock signal generated by the clock generator 133 are input into the comparator 132 in the PWM signal output unit 13A, and an output signal from the voltage controller 14B and a clock signal generated by the clock generator 133 are input into the comparator 132 in the PWM signal output unit 13B. The comparator 132 generates a PWM signal from the two signals and outputs the PWM signal. The PWM signal output from the comparator 132 is input through the AND gate 131 to the switch Q11. As described above, the PWM signal output units 13A and 13B perform PWM control on the converters 11A and 11B, respectively.

The microcomputer 16 is configured and/or programmed to include a corrector 162, a communicator 163 and a memory 164, in addition to the switching circuit 161 and other functional elements described herein. The communicator 163 is a communication device that communicates with a measuring jig (external device) connected to a port P1, and corresponds to a "first receiver" and a "second receiver".

The switching circuit 161 makes only one of the converters 11A and 11B operate, and makes the other stop. When only the converter 11A is made to operate, the switching circuit 161 outputs the H-level signal to the AND gate 131 of the PWM signal output unit 13A, and outputs the L-level signal to the AND gate of the PWM signal output unit 13B. When only the converter 11B is made to operate, the switching circuit 161 outputs the L-level signal to the AND gate 131 of the PWM signal output unit 13A, and outputs the H-level signal to the AND gate of the PWM signal output unit 13B. The switching circuit 161 and the AND gate 131 correspond to an "operation selector".

The corrector 162 corrects gains set for the variable gain amplifiers G11 of the droop characteristic generators 12A and 12B, respectively. Accordingly, drooping correction values generated by the droop characteristic generator 12A or 12B, respectively, are corrected. By correcting the drooping correction values generated by the droop characteristic generators 12A and 12B, respectively, the variations in the droop characteristics are corrected. This corrector 162 corresponds to a "first corrector" and a "second corrector".

Figure 2:
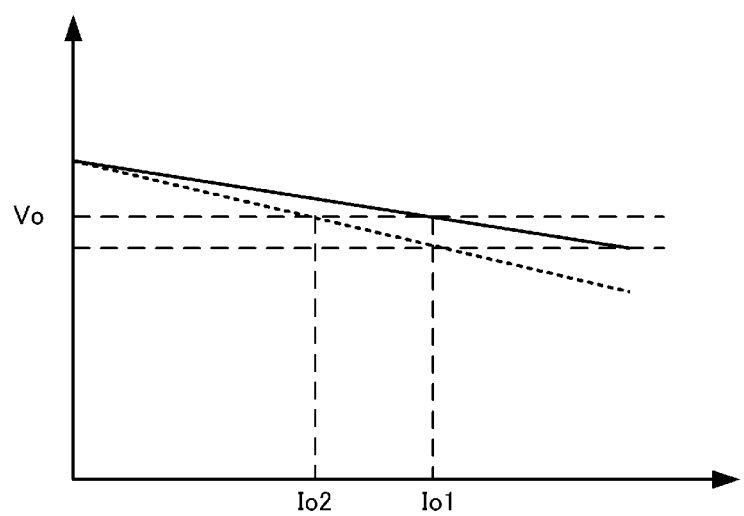
FIG. 2 is a diagram illustrating droop characteristics.

FIG. 2 is a diagram illustrating droop characteristics. A solid line indicates a droop characteristic of the converter 11A, and a dashed line indicates a droop characteristic of the converter 11B.

For example, when an output voltage of the converters 11A and 11B is Vo, then an output current of the converter 11A is Io1, and an output current of the converter 11B is Io2, thus a difference occurs between the output currents. As described above, variations in droop characteristics lead to variations in load factors of the respective converters 11A and 11B. In addition, there is a possibility that a life of one of the converters 11A and 11B that has a higher load factor is undesirably shortened. Further, it is necessary to design a switching power-supply apparatus in consideration of the variations in the droop characteristics, thus inhibiting reduction in the size of the switching power-supply apparatus 1.

Accordingly, in the switching power-supply apparatus 1, the corrector 162 corrects the drooping correction values to suppress the variations in droop characteristics. The corrector 162 corrects the drooping correction values using respective correction values determined by the external measuring jig. The measuring jig determines the correction value for each of the droop characteristic generators 12A and 12B. The communicator 163 receives the correction value determined by the measuring jig and stores the value in the memory 164. The memory 164 corresponds to a "storage".

Hereinafter, a method for determining the correction value and correcting the gain with the determined correction value will be described. The correction value is determined before factory shipment of the switching power-supply apparatus 1. The determined correction value is stored in the memory 164. After the factory shipment, the corrector 162 corrects the gain set for the variable gain amplifier G11 of each of the droop characteristic generators 12A and 12B with the correction value stored in the memory 164.

When a correction value (first correction value) for the variable gain amplifier G11 of the droop characteristic generator 12A is determined, the switching circuit 161 outputs the L-level signal to the AND gate of the PWM signal output unit 13B to stop operation of the converter 11B. The switching circuit 161 outputs the H-level signal to the AND gate 131 of the PWM signal output unit 13A.

A load of the load RL is modified, and an output voltage and an output current of the switching power-supply apparatus 1 are measured, by the measuring jig. At this time, since the operation of the converter 11B is stopped, the output voltage and the output current detected by the measuring jig are an output voltage and an output current of the converter 11A, respectively.

A droop characteristic is set from the detected output voltage and output current with the measuring jig. At this time, since the droop characteristic corresponds to a slope of an amount of a voltage drop with respect to a current, output voltages and output currents for at least two loads are detected, respectively.

The measuring jig evaluates whether or not the droop characteristic is an appropriate value. In a case of an inappropriate value, the correction value for the variable gain amplifier G11 of the droop characteristic generator 12A is adjusted, and the adjusted correction value is sent to the switching power-supply apparatus 1. The corrector 162 corrects the gain set for the variable gain amplifier G11 of the droop characteristic generator 12A with the correction value. Accordingly, the drooping correction value is also corrected.

Note that, the correction value determined by the measuring jig may be the gain set for the variable gain amplifier G11, or may be an adjustment value for adjusting the already set gain by addition or subtraction.

The above-described operations are repeated until the measuring jig evaluates the droop characteristic as an appropriate value.

As a result, the correction value for the gain of the variable gain amplifier G11 is determined.

When a correction value (second correction value) for the gain of the variable gain amplifier of the droop characteristic generator 12B is determined, the switching circuit 161 outputs the L-level signal to the AND gate 131 of the PWM signal output unit 13A to stop operation of the converter 11A. The switching circuit 161 outputs the H-level signal to the AND gate of the PWM signal output unit 13B. Then, the same or substantially the same operations as those described above are performed.

After the factory shipment, upon startup of the switching power-supply apparatus 1, the corrector 162 reads the correction values stored in the memory 164, and corrects the gains of the variable gain amplifiers G11 of the respective droop characteristic generators 12A and 12B.

As described above, one of the converters 11A and 11B connected in parallel may be stopped, thus correcting the droop characteristics generated by the respective droop characteristic generators 12A and 12B, separately. This makes it possible to reduce or prevent the variations in the droop characteristics, and obtain the determined correction value for each of the droop characteristic generators 12A and 12B. Accordingly, the characteristic of each of the droop characteristic generators 12A and 12B may be separately adjusted, thus preventing the variations in the droop characteristics. As a result, variations in respective output currents of the converters 11A and 11B may be prevented, thus making it unnecessary to design a switching power-supply apparatus in consideration of the variations, and also enabling the size of the switching power-supply apparatus 1 to be reduced.

Note that, the microcomputer 16 may prohibit a write access to the memory 164 to protect the correction value against modification after the factory shipment, and, for example, may make it impossible to modify the stored correction value unless a password is provided. Various devices other than the above-described measuring jig may be connected to the port P1. Thus, mistakenly modified memory content of the memory 164 by a connected device leads to malfunction of the switching power-supply apparatus 1. Accordingly, by protecting the correction value against the modification, this malfunction may be prevented.

Preferred Embodiment 2

Figure 3:
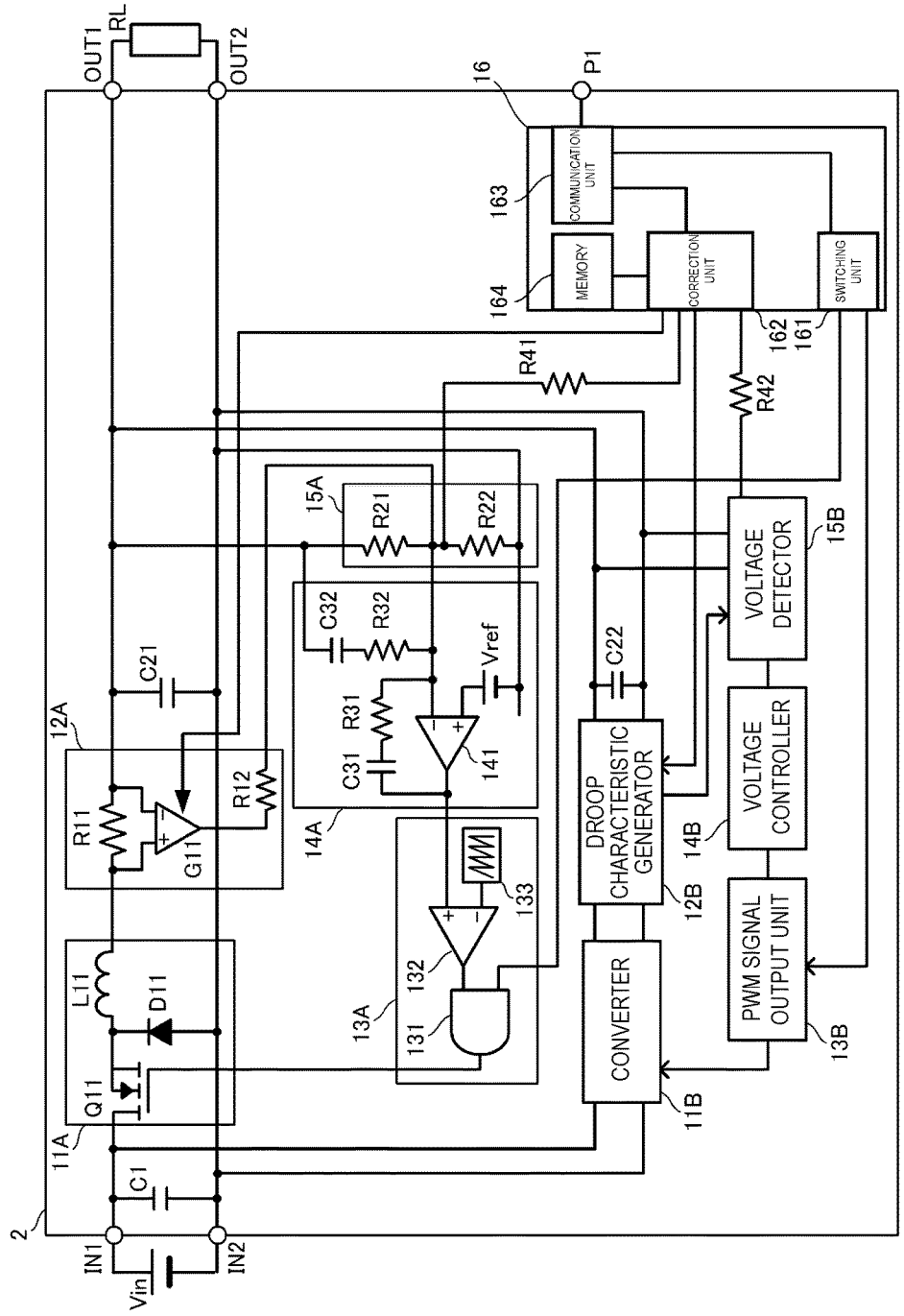
FIG. 3 is a circuit diagram of a switching power-supply apparatus according to Preferred Embodiment 2 of the present invention.

FIG. 3 is a circuit diagram of a switching power-supply apparatus 2 according to Preferred Embodiment 2 of the present invention. In the switching power-supply apparatus 2 according to the present preferred embodiment, an offset adjustment voltage is input to a node between the resistors R21 and R22 of the voltage detector 15A to adjust an output voltage from the voltage detector 15A, and to a node between the resistors R21 and 22 of the voltage detector 15B to adjust an output voltage from the voltage detector 15B. Configurations that are the same as in Preferred Embodiment will be denoted with the same reference numerals, and the description thereof will be omitted.

The switching power-supply apparatus 2 receives, from a measuring jig, correction values to correct drooping correction values generated by the respective droop characteristic generators 12A and 12B. These correction values include the correction value to correct the gain of the variable gain amplifier G11 described in Preferred Embodiment 1, and correction values to adjust offsets of output voltages of the respective voltage detectors 15A and 15B (a first voltage offset value and a second voltage offset value). The corrector 162 corrects gains set for the variable gain amplifiers G11, and outputs an offset adjustment voltage to the voltage detector 15A to adjust an offset of the output voltage of the voltage detector 15A, and to the voltage detector 15B to adjust an offset of the output voltage of the voltage detector 15B, based on the correction values.

A resistor R41 is provided on a wiring route between the corrector 162 and the voltage detector 15A and a resistor R42 is provided on a wiring route between the corrector 162 and the voltage detector 15B. Providing the resistor R41 makes it possible to add a compensation voltage to an offset adjustment voltage output to the voltage detector 15A to compensate a variation in the voltage detector 15A and providing the resistor R42 makes it possible to add a compensation voltage to an offset adjustment voltage outputted to the voltage detector 15B to compensate a variation in the voltage detector 15B.

The same or substantially the same method as in Preferred Embodiment 1 is used to determine the correction value with the measuring jig. That is, operation of one of the converters 11A and 11B is stopped. Then, a load of the load RL is modified, and an output voltage and an output current of the switching power-supply apparatus 2 are measured by the measuring jig. A droop characteristic is set from the detected output voltage and output current. Whether or not this droop characteristic is an appropriate value is evaluated, and in a case of an inappropriate value, the correction value is adjusted, and the adjusted correction value is sent to the switching power-supply apparatus 2. The above-described operations are repeated until the droop characteristic becomes an appropriate value.

As described above, by adjusting not only the gain of the variable gain amplifier G11 but also the offsets of the output voltages of the respective voltage detectors 15A and 15B, the variations in the output currents of the respective converters 11A and 11B may be further reduced or prevented. As a result, it is no longer necessary to design a switching power-supply apparatus in consideration of the variations, thus reducing the size of the switching power-supply apparatus 2.

Note that, in Preferred Embodiments 1 and 2, although the switching power-supply apparatus includes two converters 11A and 11B, the number of the converters may be three or more.

Preferred Embodiment 3

Figure 4:
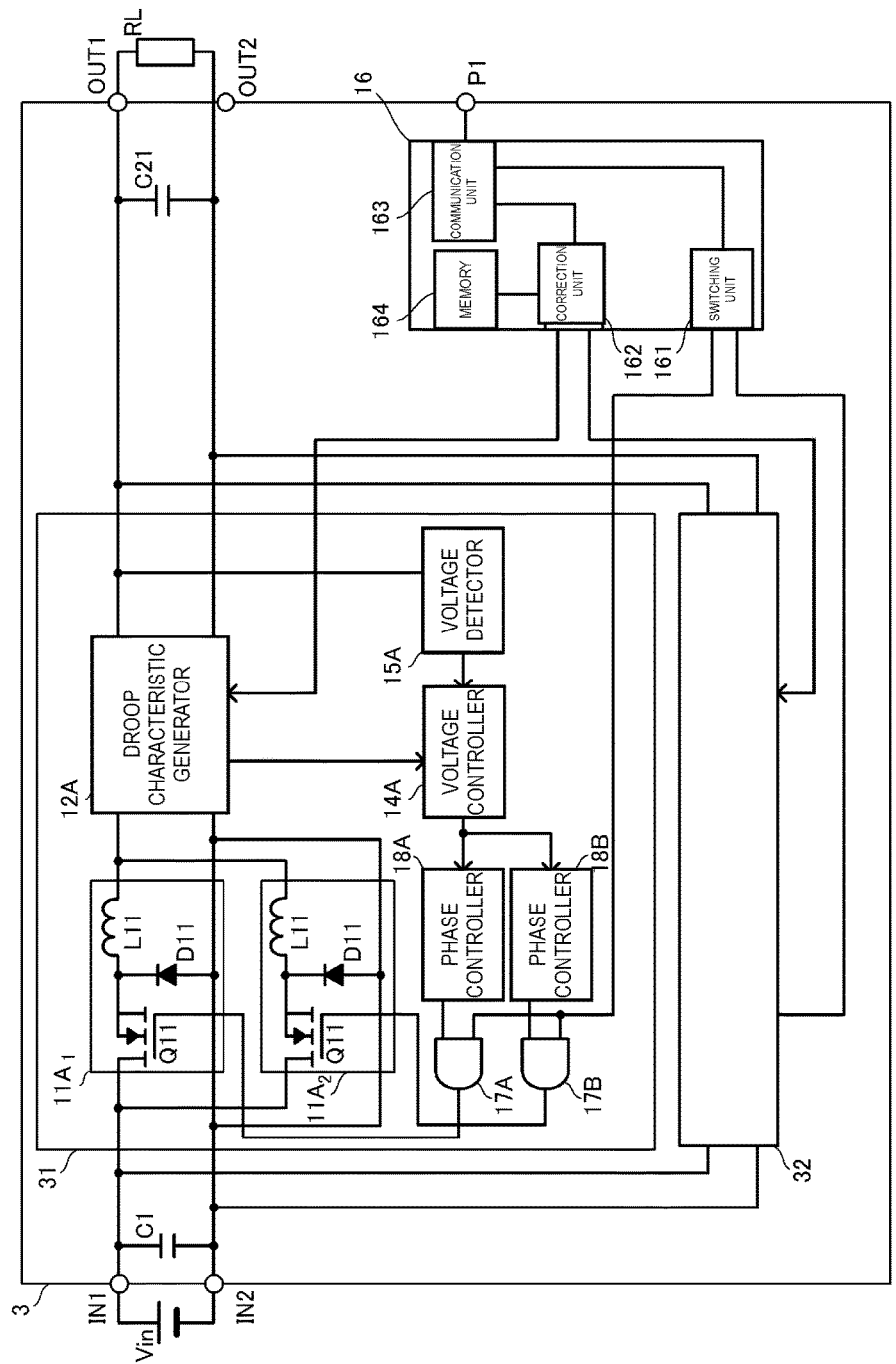
FIG. 4 is a circuit diagram of a switching power-supply apparatus according to Preferred Embodiment 3 of the present invention.

FIG. 4 is a circuit diagram of a switching power-supply apparatus 3 according to Preferred Embodiment 3 of the present invention.

The switching power-supply apparatus 3 according to the present preferred embodiment includes converter units 31 and 32 connected in parallel. The converter unit 31 corresponds to a "first power converter", and the converter unit 32 corresponds to a "second power converter". Since the converter units 31 and 32 have the same or substantially the same configuration, hereinafter the converter unit 31 will be described. Note that, circuits and elements that are the same as in Preferred Embodiment 1 will be denoted by the same reference numerals, and the description thereof will be omitted.

In the converter unit 31, two converters $11A_1$ and $11A_2$ are connected in parallel. The converter unit 31 includes two AND gates 17A and 17B, and two phase controllers 18A and 18B. An output of the AND gate 17A is connected to a gate of the switch Q11 of the converter $11A_1$, and an output of the AND gate 17B is connected to a gate of the switch Q11 of the converter $11A_2$.

An input of the AND gate 17A is connected to the switching circuit 161 of the microcomputer 16 and another input thereof is connected to the phase controller 18A, and an input of the AND gate 17B is connected to the switching circuit 161 of the microcomputer 16 and another input thereof is connected to the phase controller 18B. As described in Preferred Embodiment 1, the AND gates 17A and 17B stop the converters $11A_1$ and $11A_2$ by receiving an L-level signal from the switching circuit 161. Each of the phase controllers 18A and 18B generates a PWM signal from an output signal from the voltage controller 14A and a clock signal, and outputs the PWM signal. At this time, the phase controllers 18A and 18B each generate the PWM signals with clock signals having different phases from each other.

The microcomputer 16 receives from the measuring jig a correction value adapted to the converter unit 31. In addition, the corrector 162 corrects, based on the correction value, a gain of a variable gain amplifier of the droop characteristic generator 12A included in the converter unit 31, to correct a drooping correction value. Similarly, the microcomputer 16 receives a correction value adapted to the converter unit 32 from the measuring jig. The corrector 162 corrects, based on the correction value, a gain of a variable gain amplifier of a droop characteristic generator included in the converter unit 32, to correct a drooping correction value.

As described above, even when a plurality of converter units 31 and 32 each including the two converters $11A_1$ and $11A_2$ connected in parallel are multiphase converters connected in parallel, it is possible to reduce or prevent variations in droop characteristics, and reduce or prevent variations in output currents of the respective converter units 31 and 32, as in Preferred Embodiments 1 and 2. As a result, it is no longer necessary to design a switching power-supply apparatus in consideration of the variations, thus reducing the size of the switching power-supply apparatus 3.

Note that, although Preferred Embodiment 3 describes that the switching power-supply apparatus 3 includes the two converter units 31 and 32, the number of converter units may be three or more. Further, although the number of the converters included in each of the converter units 31 and 32 is two, the number of the converters may be three or more.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A switching power-supply apparatus comprising:
   a first power converter and a second power converter connected in parallel;
   a first output voltage detector that detects a magnitude of an output voltage of the first power converter;
   a first controller that performs PWM control on the first power converter to equalize a magnitude of an output voltage detected by the first output voltage detector and a target voltage value;
   a second output voltage detector that detects a magnitude of an output voltage of the second power converter;
   a second controller that performs PWM control on the second power converter so as to equalize a magnitude of an output voltage detected by the second output voltage detector and the target voltage value;

a first droop characteristic generator that generates a droop characteristic that reduces an output voltage of the first power converter as an output current of the first power converter increases;

a second droop characteristic generator that generates a droop characteristic that reduces an output voltage of the second power converter as an output current of the second power converter increases;

an operation selector that makes only a selected one of the first power converter and the second power converter operate;

a first receiver that receives from an external device a first correction value to correct a droop characteristic generated by the first droop characteristic generator;

a second receiver that receives from the external device a second correction value to correct a droop characteristic generated by the second droop characteristic generator;

a storage that stores a first correction value received by the first receiver and a second correction value received by the second receiver;

a first corrector that corrects a droop characteristic generated by the first droop characteristic generator with the first correction value; and a second corrector that corrects a droop characteristic generated by the second droop characteristic generator with the second correction value.

2. The switching power-supply apparatus according to claim 1, wherein the first receiver receives a first voltage offset value adapted to the first power converter;

the second receiver receives a second voltage offset value adapted to the second power converter;

the first corrector corrects a magnitude of an output voltage detected by the first output voltage detector with the first voltage offset value; and the second corrector corrects a magnitude of an output voltage detected by the second output voltage detector with the second voltage offset value.

3. The switching power-supply apparatus according to claim 1, further comprising a circuit that prohibits modification of a first correction value and a second correction value stored in the storage.

4. The switching power-supply apparatus according to claim 1, wherein the first power converter is a step-down converter circuit including an n-type MOS-FET switch, a diode, and an inductor.

5. The switching power-supply apparatus according to claim 1, wherein the second power converter is a step-down converter circuit including an n-type MOS-FET switch, a diode, and an inductor.

6. The switching power-supply apparatus according to claim 1, wherein the first droop characteristic generator includes two resistors, and a variable gain amplifier.

7. The switching power-supply apparatus according to claim 1, wherein the second droop characteristic generator includes two resistors, and a variable gain amplifier.

8. The switching power-supply apparatus according to claim 1, wherein the first output voltage detector includes voltage-dividing resistors.

9. The switching power-supply apparatus according to claim 1, wherein the second output voltage detector includes voltage-dividing resistors.

10. The switching power-supply apparatus according to claim 1, wherein the first controller includes an error amplifier and a phase compensation circuit including capacitors and resistors.

11. The switching power-supply apparatus according to claim 1, wherein the second controller includes an error amplifier and a phase compensation circuit including capacitors and resistors.

12. The switching power-supply apparatus according to claim 1, wherein the first controller includes a PWM signal output that includes an AND gate, a comparator, and a clock generator.

13. The switching power-supply apparatus according to claim 1, wherein the second controller includes a PWM signal output that includes an AND gate, a comparator, and a clock generator.

14. A droop characteristic correction method performed by a switching power-supply apparatus that performs PWM control separately on a first power converter and a second power converter connected in parallel, and makes a magnitude of an output voltage of the first power converter and a magnitude of an output voltage of the second power converter be equal or substantially equal to a target voltage value, the method comprising:

a first generation step of generating a droop characteristic that reduces an output voltage of the first power converter as an output current of the first power converter increases;

a second generation step of generating a droop characteristic that reduces an output voltage of the second power converter as an output current of the second power converter increases;

an action selection step of making only a selected one of the first power converter and the second power converter operate;

a first receiving step of receiving from an external device a first correction value that corrects a droop characteristic generated in the first generating step;

a second receiving step of receiving from the external device a second correction value that corrects a droop characteristic generated in the second generating step;

a storage step of storing a first correction value received in the first receiving step and a second correction value received in the second receiving step;

a first correction step of correcting a droop characteristic generated in the first generation step with the first correction value; and a second correction step of correcting a droop characteristic generated in the second generation step with the second correction value.

15. The droop characteristic correction method according to claim 14, further comprising a prohibition step of prohibiting modification of the first correction value and the second correction value stored in the storage step.

* * * * *